(12) United States Patent
Oliaei

(10) Patent No.: US 7,852,249 B2
(45) Date of Patent: Dec. 14, 2010

(54) SIGMA-DELTA MODULATOR WITH DIGITALLY FILTERED DELAY COMPENSATION

(75) Inventor: Omid Oliaei, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 44 days.

(21) Appl. No.: 12/394,256

(22) Filed: Feb. 27, 2009

(65) Prior Publication Data
US 2010/0219998 A1 Sep. 2, 2010

(51) Int. Cl.
*H03M 3/00* (2006.01)
(52) U.S. Cl. ........................ 341/143; 341/155
(58) Field of Classification Search ............. 341/143
See application file for complete search history.

(56) References Cited

U.S. PATENT DOCUMENTS

| 6,313,773 | B1 * | 11/2001 | Wilson et al. ............ 341/143 |
| 6,414,615 | B1 | 7/2002 | Cheng |
| 6,531,973 | B2 | 3/2003 | Brooks et al. |
| 6,909,394 | B2 | 6/2005 | Doerrer et al. |
| 7,042,377 | B2 | 5/2006 | Oliaei |
| 7,183,957 | B1 * | 2/2007 | Melanson ............. 341/143 |
| 7,535,392 | B2 | 5/2009 | Weng et al. |
| 7,633,419 | B2 * | 12/2009 | Hernandez et al. ....... 341/143 |
| 7,696,913 | B2 * | 4/2010 | Melanson ............. 341/143 |
| 2005/0068213 | A1 | 3/2005 | Fontaine et al. |
| 2008/0136693 | A1 | 6/2008 | Kim et al. |
| 2008/0272946 | A1 | 11/2008 | Melanson |

FOREIGN PATENT DOCUMENTS

WO 03052939 A2 6/2003

OTHER PUBLICATIONS

Oliaei, O., State-Space Analysis of Clock Jitter in Continuous-Time Oversampling Data Converters, IEEE Transactions on Circuits and Systems II: Analog and Digital Signal Processing, vol. 50, Jan. 2003, pp. 31-37.
Shoaei, O., Continuous-Time Delta-Sigma A/D Converters for High Speed Applications, Ph.D. Thesis, Carleton University, 1995.
Jensen, J., et al., A 3.2-GHz secondorder delta-sigma modulator implemented in InP HBT technology, IEEE J. Solid-State Circuits, vol. 30, pp. 1119-1127, Oct. 1995.

(Continued)

*Primary Examiner*—Khai M Nguyen
(74) *Attorney, Agent, or Firm*—Ingrassia, Fisher & Lorenz, P.C.

(57) ABSTRACT

Apparatus are provided for continuous-time sigma-delta modulators. The sigma-delta modulator comprises an input node for an input signal and a quantizer configured to convert an analog signal to a digital value. A main feedback arrangement is coupled to the quantizer and configured to delay the digital value by a first delay period and generate a main feedback signal by digitally filtering the first delayed value. A compensation feedback arrangement is coupled to the quantizer and configured to delay the digital value by a second delay period, wherein the second delay period is not influenced by the first delay period, and generate a compensation feedback signal by digitally filtering the second delayed value. A forward signal arrangement produces the analog signal based on the input signal, the main feedback signal, and the compensation feedback signal.

19 Claims, 6 Drawing Sheets

OTHER PUBLICATIONS

Cherry, J. A., et al., Excess loop delay in continuous-time deltasigma modulators, IEEE Transactions on Circuits and Systems II: Analog and Digital Signal Processing, vol. 46, Apr. 1999, pp. 376-389.

Oliaei, O., Design of continuous-time sigma-delta modulators with arbitrary feedback waveform, IEEE Transactions on Circuits and Systems II: Analog and Digital Signal Processing, vol. 50, Aug. 2003, pp. 437-444.

Benabes, B., et al., A Methodology for Designing Continuous-Time Sigma-Delta Modulators, in Proc. 1997 Europ. Design Test Conf., vol. 1, pp. 46-50.

Yan, S., et al., A continuous-time sigma-delta modulator with 88-dB dynamic range and 1.1-MHz signal bandwidth, in Dig. Tech. Papers 2003 IEEE Int. Solid-State Circuits Conf., vol. 1, pp. 62-63 and 471-478.

Mitteregger, G. et al., A 14b 20mW 640MHz CMOS CT ADC with 20MHz Signal Bandwidth and 12b ENOB, in Dig. Tech. Papers 2006 IEEE Int. Solid-State Circuits Conf., pp. 131-140.

Fontaine, P., et al., A low-noise low-voltage CT modulator with digital compensation of excess loop delay, in Dig. Tech. Papers 2005 IEEE Int. Solid-State Circuits Conf., vol. 1, pp. 498-499 and 613.

Keller, M., et al., A Comparative Study on Excess Loop Delay Compensation Techniques for Continuous-Time Sigma-Delta Modulators, IEEE Transactions on Circuits and Systems I, vol. 55, No. 11, pp. 3480-3487, Dec. 2008.

Luschas, S., et al., High-speed sigmadelta modulators with reduced timing jitter sensitivity, IEEE Trans. Circuits Syst. II, Analog Digit. Signal Process., vol. 49, No. 11, pp. 712-720, Nov. 2002.

Ortmanns, M., et al., A Continuous-time Sigma-Delta Modulator with Reduced Sensitivity to Clock Jitter through SCR Feedback, IEEE Transactions on Circuits and Systems I: Fundamental Theory and Applications, vol. 52, May 2005, pp. 875-884.

Colodro, F., et al., New Continuous-Time Multibit Sigma-Delta Modulators with Low Sensitivity to Clock Jitter, IEEE Transactions on Circuits and Systems, vol. 56, No. 1, Jan. 2009.

Su, D., et al., A CMOS Oversampling D/A Converter with a Current-Mode Semi-Digital Reconstruction Filter, IEEE J. Solid-State Circuits, vol. 28, pp. 1224-1233, Dec. 1993.

Oliaei, O., Sigma-Delta Modulator with Spectrally Shaped Feedback, IEEE Transactions on Circuits and Systems II: Analog and Digital Signal Processing, vol. 50, Oct. 2003, pp. 518-530.

Putter, B., Sigma-Delta ADC with Finite Impulse Response Feedback DAC, IEEE International Solid-State Circuits Conference, 2004, Feb. 2004, pp. 76-77.

Vaidyanathan, P. P., Multirate Systems and Filter Bank, Polyphase Networks, and Applications: A Tutorial, Proceeding of the IEEE vol. 78, No. 1, Jan. 1990.

Horbach, U., Design of a 20 Bit Sigma-Delta A/D-Converter for Audio Applications, in Proc. 1990 IEEE Int. Symp. Circuits Syst., vol. 4, pp. 2789-2792.

Schreier, R., et al., Delta-Sigma Modulators Employing Continuous-Time Circuitry, IEEE Transactions on Circuits and Systems I: Fundamental Theory and Applications, vol. 43, Apr. 1996, pp. 324-332.

Yan, S., et al., A continuous-time sigma-delta modulator with 88-dB dynamic range and 1.1-MHz signal bandwidth, IEEE Jornal of Solid-State Circuits, vol. 39 No. 1, Jan. 2004 pp. 75-86.

Mitteregger, G. et al., A 20mW 640MHz CMOS CT sigmadelta ADC with 20MHz Signal Bandwidth 80-dB Dynamic Range and 12b ENOB, IEEE Solid-State Circuits, vol. 41, No. 12, Dec. 2006, pp. 2641-2649.

Shoaei, O., Design and Implementation of a Tunable 40 MHz-70 Mhz Gm_C Bandpass sigmadelta Modulator, IEEE Transactions on Circuits and Systems -II: Analog and Digital Signal Processing, vol. 44, No. 7, Jul. 1997.

Office Action in U.S. Appl. No. 12/394,275 dated Jun. 1, 2010.

* cited by examiner

SIGMA-DELTA MODULATOR WITH DIGITALLY FILTERED DELAY COMPENSATION

TECHNICAL FIELD

Embodiments of the subject matter described herein relate generally to mixed-signal circuits, and more particularly, embodiments of the subject matter relate to continuous-time sigma-delta modulators.

BACKGROUND

In many modern electronics applications, it is desirable to convert an analog signal to a digital value. For example, in a radio frequency (RF) transceiver, a received analog RF signal may be demodulated to an analog baseband signal which is then converted to a digital baseband signal for subsequent digital signal processing. Many electrical systems utilize analog-to-digital converters (ADCs) to convert an analog signal to a digital value. However, because of the finite nature of digital representation, quantization error (which is the difference between the actual analog value and quantized digital value due to rounding or truncation) is an imperfection inherent to the analog-to-digital conversion. In some ADCs, sigma-delta modulation (or alternatively, delta-sigma modulation) is used to reduce the effect of quantization error and improve signal-to-noise ratio (SNR). Sigma-delta modulation (alternatively referred to as delta-sigma modulation) adds or subtracts quantization error to a forward signal path using feedback loops and integrator circuits. The quantization error is oversampled at a frequency greater than the analog input signal frequency, thereby allowing it to be filtered at the integrators without noticeably impacting the signal.

Many systems utilize continuous-time sigma-delta modulators, that is, sigma-delta modulators constructed using continuous-time circuitry. Continuous-time sigma-delta modulators can be clocked at higher sampling frequencies which improves the performance of the sigma-delta modulator. In practice, however, high-speed sigma-delta modulators (generally sigma-delta modulators with sampling frequencies in the MHz range or higher) suffer from various circuit level effects which can lead to instability and degrade performance (e.g., SNR) of the modulator. Many modulators exhibit delay, referred to as excess loop delay, that results from, for example, the nonzero switching time of transistors and/or comparators utilized in the quantizer and/or digital-to-analog converters (DACs) in the feedback loop. In addition, at higher speeds, clock jitter and/or intersymbol interference (ISI) begin to distort the waveforms of the feedback signals. While these problems may be reduced with improvements to the hardware and/or electrical components, in general, these improvements entail prohibitive increases in cost, area, and power consumption.

Some prior art systems utilize finite impulse response (FIR) filters in single-bit ADCs to filter each feedback signal (i.e., the number of FIR filters is equal to the number of integrators) in the feedback loop to reduce the modulator's sensitivity to clock jitter. However, in practical implementations, the loop delay creates instability, which requires these systems to be realized with either return-to-zero (RZ) DACs or by deteriorating the noise shaping capability of the modulator by reducing the out-of-band gain of the noise transfer function for the system. Using RZ DACs is undesirable because it increases the slew rate requirements for the integrators and/or other components of the modulator, which in turn increases the area and/or power consumption of the modulator. Reducing the out-of-band gain of the noise transfer function for the system is undesirable, as it degrades the SNR for the modulator. In addition, to adapt these prior art systems for multi-bit operation with adequate linearity, the feedback path must often be modified to include mismatch shaping components to account for component mismatch between the additional DACs included in the feedback path. These mismatch shaping components further exacerbate the loop delay and the resulting instability of the modulator.

Some other prior art systems attempt to mitigate the effects of loop delay by purposely inserting a constant delay in the feedback path of the sigma-delta modulator and compensating for the constant delay with an additional term in the modulator transfer function. In some prior art systems, this results in an increased voltage swing at the input of the quantizer. To offset this voltage swing, the overall gain of the modulator must be reduced, thereby reducing SNR. In addition, this approach creates a summing junction at the input of the quantizer. In order to process the high frequency signals present at the summing junction, the summing junction is often realized using an analog summer (e.g., a high-speed summing amplifier) which increases the power and area requirements for the modulator. In some prior art systems, the additional feedback path is moved from the input of the quantizer to the input of the integrator that precedes the quantizer. This increases the slew rate at the input of the integrator, resulting in an integrator that consumes additional power and area, which offsets and power and/or area savings from eliminating the analog summer. Other systems utilize proportional-integral (PI) compensation or other techniques which degrade the frequency response of the integrator and may lead to out-of-band peaking and other undesirable effects. However, these prior art systems fail to address the modulator's sensitivity to clock jitter, ISI, and other circuit level effects.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
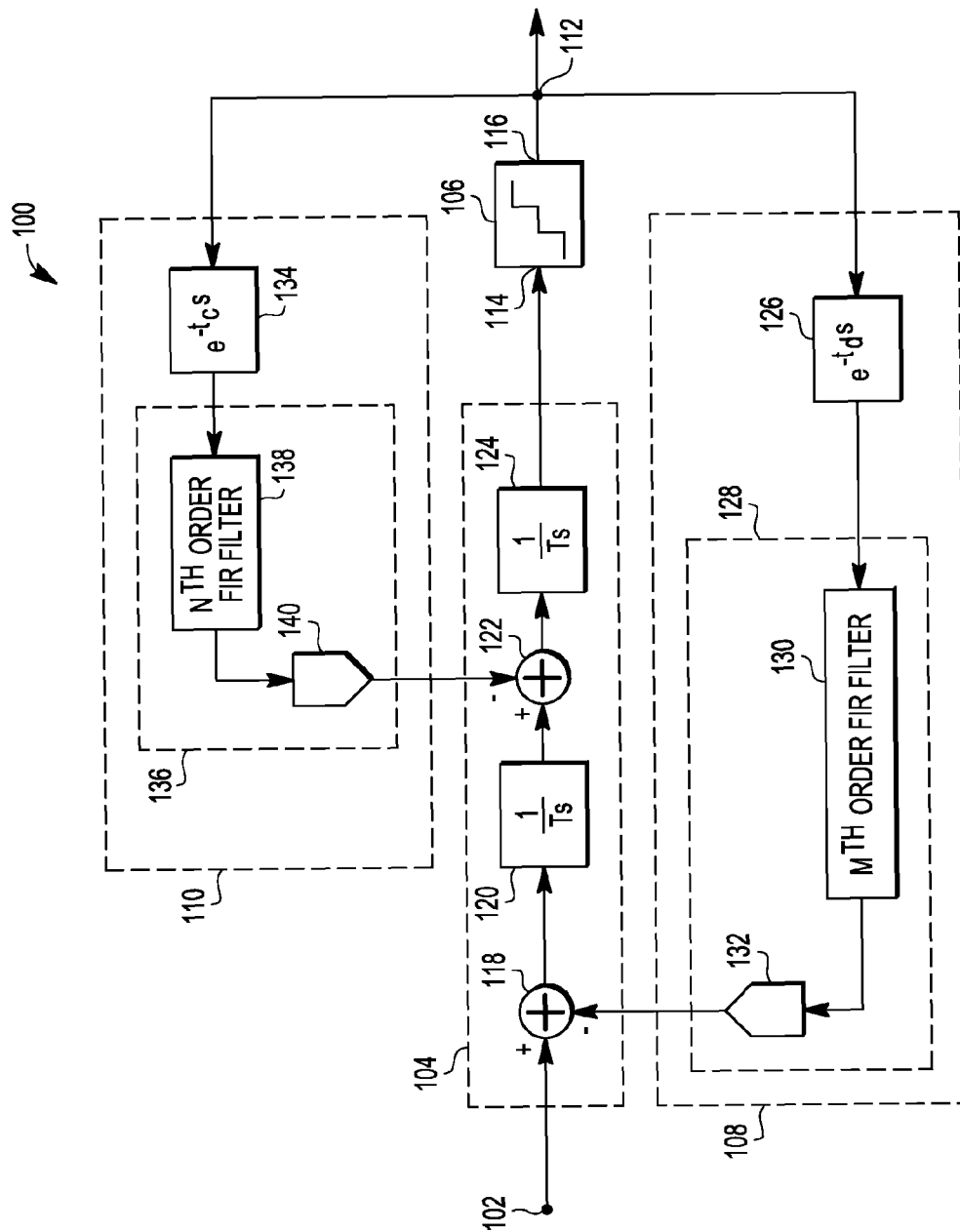
FIG. 1 is a block diagram of a sigma-delta modulator in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the following description for the purpose of reference only, and thus are not intended to be limiting. For example, terms such as "first", "second" and other such numerical terms referring to structures do not imply a sequence or order unless clearly indicated by the context.

For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and methods for reducing the sensitivity of a continuous-time sigma-delta modulator to circuit level effects, such as clock jitter or intersymbol interference (ISI), while at the same time compensating for excess loop delay. The subject matter described herein provides a sigma-delta modulator that is suitable for multi-bit operation and may be implemented with relatively low complexity. As a result, the area, power, cost and design time of the sigma-delta modulator are reduced while simultaneously improving the performance of the modulator.

FIG. 1 depicts an exemplary embodiment of a sigma-delta modulator 100 suitable for use in an analog-to-digital converter (ADC) or another analog-to-digital conversion application. In an exemplary embodiment, the sigma-delta modulator 100 is realized as a continuous-time sigma-delta modulator comprising suitably configured continuous-time circuitry. The sigma-delta modulator 100 may include, without limitation, an input node 102 for receiving an input signal, a forward signal arrangement 104 configured to establish a forward signal path, a quantizer 106, a main feedback arrangement 108 configured to establish a main feedback signal path, a compensation feedback arrangement 110 configured to establish a compensation feedback signal path, and a digital output 112. The elements of the sigma-delta modulator 100 are suitably configured to produce a digital value at the digital output 112 that is representative of an analog input signal at the input node 102.

It should be understood that FIG. 1 is a simplified diagram of the sigma-delta modulator 100 depicted in single-ended form, and practical embodiments of the sigma-delta modulator 100 may include additional or alternative components, and/or be implemented in a differential manner (e.g., as a differential circuit adapted for differential input signals). In this regard, the sigma-delta modulator 100 may be configured for single-bit operation or multi-bit operation, depending on the particular needs of a given application. It should also be understood that FIG. 1 depicts a second-order feedback sigma-delta modulator 100 for purposes of explanation, and the subject matter described herein is not intended to be limited to any particular sigma-delta topology. The subject matter can be adapted for a forward signal arrangement 104 having any order, and may be implemented using any suitable sigma-delta topology.

In an exemplary embodiment, the input node 102 is coupled to the forward signal arrangement 104 which, in turn, is coupled to the analog input 114 of the quantizer 106. The quantizer 106 converts an analog signal at the quantizer input 114 to a digital value at the quantizer output 116 which, in turn, is coupled to the digital output 112. The main feedback arrangement 108 (or main feedback path) comprises a combination of functional, hardware, and/or logical elements coupled between the digital output 112 and the forward signal arrangement 104, wherein the main feedback arrangement 108 defines a feedback signal path for one or more main feedback signals, as described in greater detail below. In an exemplary embodiment, the main feedback arrangement 108 is configured to delay the digital value at the digital output 112 by a first delay period ($t_d$) and generate a main feedback signal based on the delayed value. Similarly, the compensation feedback arrangement 110 (or compensation feedback path) comprises a combination of functional, hardware, and/or logical elements coupled between the digital output 112 and the forward signal arrangement 104, wherein the compensation feedback arrangement 110 defines a feedback signal path for one or more compensation feedback signals. As described in greater detail below, the compensation feedback path 110 is configured to delay the digital value at the digital output 112 by a second delay period ($t_c$) and generate a compensation feedback signal based on the delayed value.

The forward signal arrangement 104 (or forward signal path) comprises a combination of hardware, and/or logical elements which are suitably configured to produce the analog signal at the quantizer input 114 based on the input signal at the input node 102, the main feedback signal from the main feedback arrangement 108, and the compensation feedback signal from the compensation feedback arrangement 110. In this regard, the first delay period ($t_d$) represents an intentional delay inserted into the main feedback arrangement 108 to compensate for the loop delay caused by the analog components of the sigma-delta modulator 100. The second delay period ($t_c$) represents a delay used to create compensation feedback signals that compensate for the difference between the value of the first delay period and the actual loop delay exhibited by the electrical components of the sigma-delta modulator 100.

Depending on the embodiment, the forward signal path 104 may be realized with any order and using any suitable sigma-delta circuit topology, such as, for example, a lowpass topology, a bandpass topology, a highpass topology, a feedback topology, a feedforward topology, a feedforward-feedback topology or another hybrid topology, a cascade topology, a quadrature or complex topology, and the like. As shown in FIG. 1, in accordance with one embodiment, the forward signal path 104 is realized as a second-order sigma-delta feedback topology including, without limitation, a first summing junction 118, a first integrator 120, a second summing junction 122, and a second integrator 124. The first summing junction 118 is coupled between the input node 102 and the input of the first integrator 120. The second summing junction 122 is coupled between the output of the first integrator 120 and the input of the second integrator 124. The output of the second integrator 124 is connected to the quantizer input 114 and the second integrator 124 produces an analog signal at the quantizer input 114.

In an exemplary embodiment, the quantizer 106 is configured to generate a digital value at the digital output 116 that comprises one or more bits which are representative of the analog signal (or analog voltage level) at the quantizer input 114. Depending on the embodiment, the quantizer 106 may be realized as a single-bit quantizer or a multi-bit quantizer. The quantizer 106 generates the digital value at by sampling the analog signal at the quantizer input 114 with a particular operating frequency or sampling frequency ($f_s$). In this regard, the sampling period or sampling interval (e.g., the time between samples) is the inverse of the sampling frequency $$\left(\frac{1}{f_s}\right).$$

For example, a continuous-time sigma-delta modulator 100 used in a communications application may have a sampling frequency ranging from the tens of MHz to hundreds of MHz, however, it will be appreciated in the art that the sampling frequency of the quantizer 106 will vary depending on the needs of a particular application (e.g., the desired effective number of bits). Depending on the embodiment, the quantizer 106 may utilize a flash analog-to-digital conversion architecture or another suitable conversion architecture, and may be configured for any number of output bits or any noise shaping. In practice, there is a non-zero delay between the time of a signal change at the quantizer input 114 and the time at which the digital value at the quantizer output 116 changes in response to the signal change. For example, if the quantizer 106 is realized as a differential flash ADC, the preamplifiers and/or comparators within the quantizer 106 may exhibit a non-zero rise time and/or a non-zero settling time.

In an exemplary embodiment, the main feedback path 108 includes a main feedback delay element 126 and a main feedback digital-to-analog (D/A) conversion arrangement 128. The input of the main feedback delay element 126 is connected to the digital output 112 (or quantizer output 116) and the main feedback delay element 126 is configured to delay the digital value at the digital output 112 by the first delay period ($t_d$). As set forth above, the first delay period represents an intentional delay inserted into the main feedback path 108 which is intended to compensate for the loop delay of the sigma-delta modulator 100 (e.g., the delays introduced by the forward signal path 104, the quantizer 106, and/or DACs in the feedback paths 108, 110). In this regard, the first delay period may be any arbitrary time period between zero and length of one sampling period $$\left(e.g., \frac{1}{f_s}\right).$$

In an exemplary embodiment, the first delay period is intended to absorb the loop delay of the sigma-delta modulator 100, that is, the value of the first delay period is greater than or equal to the actual delay associated with the analog components of the modulator 100. In an exemplary embodiment, the main feedback delay element 126 is realized as a digital delay element, such as, for example, a flip-flop, a latch, and the like). Various implementation aspects of delaying a signal are well known, and as such, will not be described in detail herein.

Figure 2:
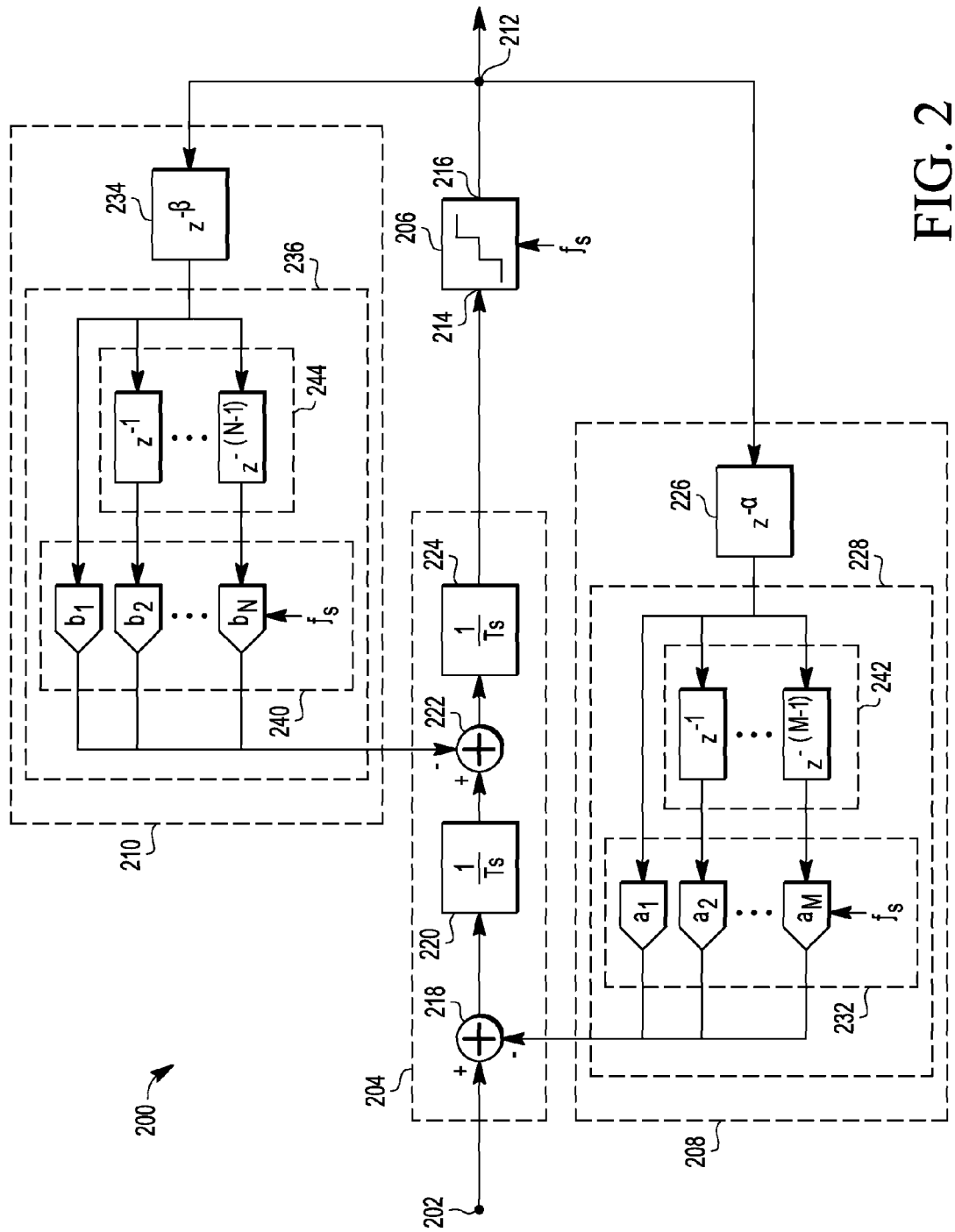
FIG. 2 is a block diagram of a sigma-delta modulator in accordance with another embodiment of the invention.
Figure 3:
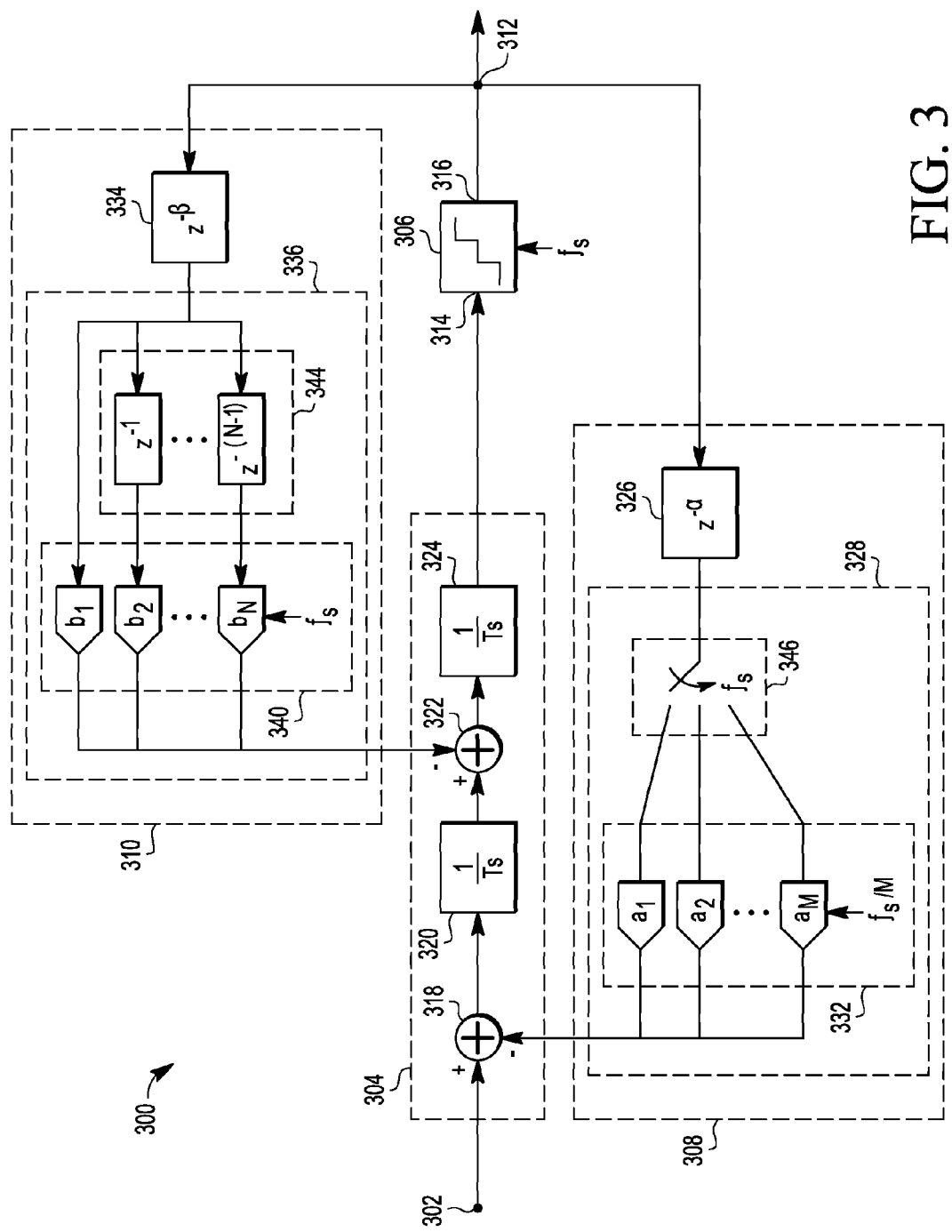
FIG. 3 is a block diagram of a sigma-delta modulator in accordance with yet another embodiment of the invention.
Figure 4:
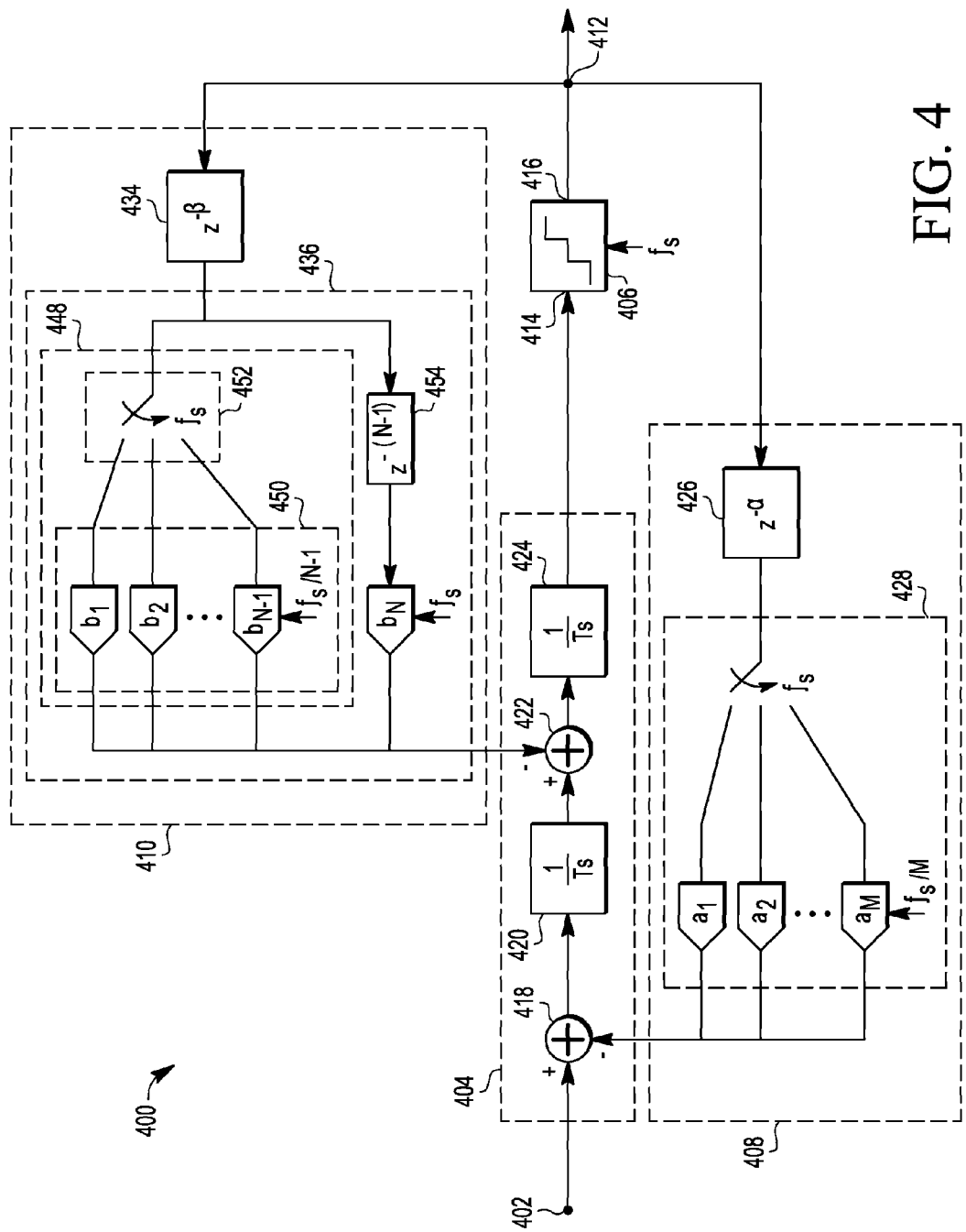
FIG. 4 is a block diagram of a sigma-delta modulator in accordance with one embodiment of the invention.

In an exemplary embodiment, the main feedback D/A conversion arrangement 128 is coupled between the output of the main feedback delay element 126 and the input node 102 (e.g., the input of the of the sigma-delta modulator 100) at the first summing junction 118. The main feedback D/A conversion arrangement 128 generates a main feedback signal at the summing junction 118 by digitally filtering the delayed value at the output of the main feedback delay element 126. In this regard, the main feedback D/A conversion arrangement 128 comprises a finite impulse response (FIR) filtering arrangement 130 and one or more digital-to-analog converters (DACs) 132 cooperatively configured to digitally filter the delayed value at the output of the main feedback delay element 126. In this regard, although FIG. 1 depicts the FIR filtering arrangement 130 and the DACs 132 as separate elements, in practice, the FIR filtering arrangement 130 and DACs 132 may be combined or otherwise implemented in an integral fashion to digitally filter the delayed value at the output of the main feedback delay element 126, as shown in FIGS. 2-4 and described in greater detail below. Depending on the embodiment, the FIR filter may be realized as an integer-delay FIR filter or a fractional-delay FIR filter, that is, an FIR filter where the filter delays are a rational fraction of the sampling interval (e.g., $z^{-1/2}$, $z^{-3/2}$, etc.). In an exemplary embodiment, the FIR filtering arrangement 130 is configured to create a lowpass FIR filter having an order M, where M is an integer number greater than or equal to two. In this regard, the main feedback D/A conversion arrangement 128 produces an analog feedback signal at the first summing junction 118 that is a function of the preceding M clock intervals of the signal at the output of the main feedback delay element 126.

In an exemplary embodiment, the compensation feedback path 110 includes a compensation feedback delay element 134 and a compensation feedback digital-to-analog D/A conversion arrangement 136. The input of the compensation feedback delay element 134 is connected to the digital output 112 (or quantizer output 116) and the compensation feedback delay element 134 is configured to delay the digital value at the digital output 112 by the second delay period ($t_c$). As set forth above, the second delay period represents a delay inserted into the compensation feedback path 110 which is intended to compensate for the effect of the excess loop delay resulting from the first delay period. In this regard, the length of time of the second delay period may be chosen to be any arbitrary time period between zero and length of one sampling period (e.g., $$\frac{1}{f_s}$$

where $f_s$ is the sampling frequency). The second delay period is preferably chosen to be greater than the excess loop delay, and is different than the first delay period, as described in greater detail below. The compensation feedback delay element 134 is preferably realized as a digital delay element as described above in the context of main feedback delay element 126.

In an exemplary embodiment, the compensation feedback digital-to-analog D/A conversion arrangement 136 is coupled between the output of the compensation feedback delay element 134 and the forward signal path 104. In the illustrated embodiment, the compensation feedback digital-to-analog D/A conversion arrangement 136 is coupled to the summing junction 122 before the integrator 124 immediately preceding the quantizer input 114. The compensation feedback D/A conversion arrangement 136 generates a compensation feedback signal at the summing junction 122 by digitally filtering the delayed value at the output of the compensation feedback delay element 134. In this regard, the compensation feedback D/A conversion arrangement 136 comprises a finite impulse response (FIR) filtering arrangement 138 and one or more DACs 140 cooperatively configured to digitally filter the delayed value at the output of the compensation feedback delay element 134. As described above, in practice, the FIR filtering arrangement 138 and DACs 140 may be combined or otherwise implemented in an integral fashion, as shown and described in greater detail below. In an exemplary embodiment, the FIR filtering arrangement 138 is configured to create an FIR filter having an order N, where N is an integer number greater than or equal to two, and depending on the embodiment, the FIR filter may be realized as an integer-delay FIR filter or a fractional-delay FIR filter. In this regard, the compensation feedback D/A conversion arrangement 136 produces an analog feedback signal at the second summing junction 122 that is a function of the preceding N clock intervals of the signal at the output of the compensation feedback delay element 134.

For the second-order feedback modulator 100 shown in FIG. 1, the first summing junction 118 is configured to subtract the main feedback signal (from the main feedback D/A conversion arrangement 128) from the input signal at the input node 102 and provide the result to input of the first integrator 120. The first integrator 120 integrates the resultant signal at the first summing junction 118 in a conventional manner, as will be appreciated in the art. The second summing junction 122 is configured to subtract the compensation feedback signal (from compensation feedback D/A conversion arrangement 136) from the output of the first integrator 120 and provide the result to the second integrator 124. The second integrator 124 integrates the resultant signal at the second summing junction 122 to produce the analog signal at the quantizer input 114. In this manner, the analog signal at the quantizer input 114 is based on the input signal, the main feedback signal, and the compensation feedback signal.

It should be noted that in an exemplary embodiment, by virtue of the separate compensation feedback path 110, the second delay period is structurally independent of the first delay period, that is, the second delay period is not influenced by the first delay period and the first delay period is not influenced by the second delay period. Notably, in the illustrated embodiment, the delay elements 126, 134 are in distinct feedback paths and are not cascaded (or non-cascaded) or otherwise interconnected, for example, the output of one delay element does not feed the input of another. In this manner, the first delay period and the second delay period are uncorrelated as the second delay period is not influenced or affected by the components and/or embedded delays in the main feedback path 108 and the first delay period is not influenced or affected by the components and/or embedded delays in the compensation feedback path 110. In an exemplary embodiment, the first delay period and the second delay period are not equal. In other words, the value of the second delay period is not chosen to be equal to the first delay period or vice versa. Preferably, the first delay period and the second delay period are each chosen to be a value greater than the actual loop delay of the components of the modulator 100. Depending on the embodiment, the second delay period may be less than the first delay period or greater than the first delay period.

In an exemplary embodiment, the DACs 132, 140 of the D/A conversion arrangements 128, 136 are realized as no-return-to-zero (NRZ) DACs that use a NRZ pulse scheme to generate the respective feedback signal, such that the respective feedback signals generated by the DACs 132, 140 are substantially constant (e.g., within practical and/or realistic operating tolerances) for the duration of a sampling period. This relaxes the slew rate requirements for the integrators of the forward signal arrangement 104, allowing them to consume less power and/or area.

It should also be noted that in the sigma-delta modulator 100 of FIG. 1, only a single compensation feedback signal is needed to compensate for both the intentional delay ($t_d$) inserted in the main feedback path 108 and the FIR filtering arrangement 130. The sigma-delta modulator 100 shown in FIG. 1 achieves excess loop delay compensation and reduced jitter sensitivity with limited complexity, that is, by using only two FIR filters 130, 138 and two feedback signals. In this regard, only two FIR filters 130, 138 need be used with any order of the forward signal arrangement 104 (e.g., any number of integrators). Although using additional feedback signals and/or FIR filters offers additional degrees of freedom, the sigma-delta modulator 100 of FIG. 1 compensates for excess loop delay and achieves reduced sensitivity to circuit-level effects (e.g., jitter and intersymbol interference) in a simple and efficient manner. It should be noted that by virtue of the compensation feedback path 110, the sigma-delta modulator 100 can achieve multi-bit operation by including mismatch shaping components in the main feedback path 108 without suffering instability by adjusting the delay period for either or both delay elements 126, 134 to account for the delay of the mismatch shaping components. In addition, in embodiments where the compensation feedback path 110 is not be coupled to the input of the modulator 100, the compensation feedback path 110 may be implemented for multi-bit operation without including mismatch shaping in the compensation feedback path 110. This is because the compensation feedback path 110 is coupled to the forward signal path at a location further from the input node 102 (in terms of the number of intervening elements between the input node 102 and the compensation feedback path 110) than the main feedback path 108, which is coupled to the input node 102, and as such, the inaccuracy of the compensation feedback path 110 has less of an impact on the overall performance of the modulator 100. In other words, in an exemplary embodiment, the compensation feedback path 110 is coupled to the forward signal path 104 at a summing junction (e.g., summing junction 122), wherein there is at least one intervening element (e.g., an integrator, filter, amplifier, etc.) of the forward signal path 104 coupled between the input node 102 and the summing junction.

FIG. 2 depicts a sigma-delta modulator 200 in accordance with one embodiment. The sigma-delta modulator 200 is realized as a continuous-time sigma-delta modulator including, without limitation, an input node 202 for receiving an input signal, a forward signal arrangement 204 (or forward signal path), a quantizer 206, a main feedback arrangement 208 (or main feedback path), a compensation feedback arrangement 210 (or compensation feedback path), and a digital output 212. The elements of the sigma-delta modulator 200 are similar to counterpart elements discussed above in the context of sigma-delta modulator 100 of FIG. 1, and as such, these common elements will not be redundantly described in detail here in the context of FIG. 2. In the illustrated embodiment of FIG. 2, the main feedback delay element 226 and the compensation feedback delay element 234 are each realized as a digital delay element, wherein the associated delay periods are represented in the Z-domain, as will be appreciated in the art. In this regard, the delay periods may be any arbitrary time period between zero and one sample.

As shown, in accordance with one embodiment, the main feedback D/A conversion arrangement 228 is realized as a plurality of digital delay elements 242 and a plurality of DACs 232 cooperatively configured to create a lowpass FIR filter with an order of M. In this regard, for an integer-delay FIR filter, the D/A conversion arrangement 228 comprises M DACs 232 and M−1 digital delay elements 242, as will be appreciated in the art. In an exemplary embodiment, the coefficients of the FIR filter ($a_1$ through $a_M$) are implemented as a gain associated with a corresponding DAC 232. In an exemplary embodiment, the DACs 232 are realized as current mode NRZ DACs, each being clocked or operated at the same sampling frequency as the quantizer 206 (e.g., $f_s$), wherein the output of each DAC 232 is connected to the summing junction 218 at the input of the sigma-delta modulator 200. The FIR filter is realized as a lowpass filter, that is, the sum of the coefficients of the FIR filter ($a_1$ through $a_M$) is less than or equal to one. In an exemplary embodiment, the FIR filter is realized as a lowpass comb filter, wherein each coefficient of the filter is equal to one divided by M $$\left(\text{e.g., } a_i = \frac{1}{M}\right).$$

In a similar manner, the compensation feedback D/A conversion arrangement 236 is realized as a plurality of digital delay elements 244 and a plurality of DACs 240 cooperatively configured to create a FIR filter with an order of N. In this regard, the D/A conversion arrangement 236 comprises N DACs 240 and N−1 digital delay elements 244, as will be appreciated in the art. In an exemplary embodiment, the coefficients of the FIR filter ($b_1$ through $b_N$) are implemented as a gain associated with the corresponding DAC 240. The coefficients of the FIR filter in the compensation feedback path ($b_1$ through $b_N$) are preferably determined by choosing the coefficients for the FIR filter in the main feedback path (e.g., the gains of the DACs 232) and solving for a desired noise transfer function. As shown, the output of each DAC 240 is connected to the summing junction 222 before the input of the integrator 224 immediately preceding the quantizer 206.

FIG. 3 depicts a sigma-delta modulator 300 in accordance with another embodiment. The elements of the sigma-delta modulator 300 are similar to counterpart elements discussed above in the context of sigma-delta modulator 100 of FIG. 1 and/or sigma-delta modulator 200 of FIG. 2, and as such, these common elements will not be redundantly described in detail here in the context of FIG. 3. In the illustrated embodiment of FIG. 3, the main feedback D/A conversion arrangement 328 comprises a polyphase digital-to-analog conversion arrangement. The polyphase digital-to-analog conversion arrangement is the result of performing polyphase decomposition of the $M^{th}$-order lowpass filter structure described above in the context of FIG. 2. In this regard, the polyphase digital-to-analog conversion arrangement comprises M number of DACs 332, each having a gain (or coefficient) of $$\frac{1}{M},$$

and a switching element 346 coupled between the DACs 332 and the output of the main feedback delay element 326. In this regard, the switching element 346 comprises a combination of flip-flops, delay elements, and other electrical components which are suitably configured to effectuate a rotating switch with M operating modes (or connection modes). Each operating mode corresponds to an effective electrical connection between the output of the main feedback delay element 326 and the input of a respective DAC 332, wherein the switching element 346 is configured to cycle or rotate through the operating modes in a sequential manner with a frequency equal to the sampling frequency of the quantizer 306 (e.g., $f_s$).

By virtue of the polyphase decomposition, each DAC 332 may be clocked or operated at a frequency equal to $$\frac{f_s}{M}.$$

It should be noted that because the main feedback signal from the main feedback path 308 is fed back into the input of the modulator 300, the modulator 300 is most sensitive to non-idealities of the DACs 332 in the main feedback path 308 because the main feedback signal is directly subtracted from (or added to) the input signal at the input node 302. Therefore, by reducing the sampling frequency of the DACs 332 in the main feedback path 308, the DACs 332 are less susceptible to harmonic distortion and/or ISI and have a greater tolerance for (or reduced sensitivity to) clock jitter, resulting in a more accurate main feedback signal at the input of the modulator 300. For example, simulation results show that a second-order modulator with a fourth-order (M=4) polyphase digital-to-analog conversion arrangement in the main feedback path 308 provides a 12 dB improvement in clock jitter sensitivity relative to a conventional system. The effective frequency of the sigma-delta modulator 300 is a factor of M times greater than the actual sampling frequency of the DACs 332, that is, the quantizer 306 sampling frequency, $f_s$. In other words, if the non-idealities of the DAC hardware limit the practical sampling frequency of the DACs 332 to $f_{max}$, the effective frequency of the modulator 300 may be increased to $M \times f_{max}$. For example, assuming M=4, if the DACs 332 are limited to a sampling frequency of 200 MHz, the modulator 300 may still achieve an effective sampling frequency of 800 MHz without compromising stability, signal-to-noise ratio (SNR), or other performance metrics. It should be noted that in the illustrated embodiment, the sampling frequency of the DACs 340 in the compensation feedback path 310 may remain equal to the sampling frequency of the quantizer 306. This is because the non-idealities of the DACs 340 in the compensation feedback path 310 may be shaped by virtue of the forward signal path 304 and/or the main feedback path 308, and thus, the non-idealities of the DACs 340 in the compensation feedback path 310 have negligible impact on the performance of the modulator 300. As a result, the compensation feedback path 310 may be implemented with reduced cost and/or complexity relative to the main feedback path 308.

FIG. 4 depicts a sigma-delta modulator 400 in accordance with another embodiment. The elements of the sigma-delta modulator 400 are similar to counterpart elements discussed above in the context of the sigma-delta modulators of FIGS. 1-3, and as such, these common elements will not be redundantly described in detail here in the context of FIG. 4.

In the illustrated embodiment of FIG. 4, the compensation feedback D/A conversion arrangement 436 comprises a polyphase digital-to-analog conversion arrangement 448. In this regard, the first through N−1 terms of the FIR filtering arrangement in the compensation feedback path 410 are implemented as a N−1 order lowpass comb filter, such that the polyphase digital-to-analog conversion arrangement 448 is the result of performing polyphase decomposition of the N−1 order lowpass comb filter, in a similar manner as described above in the context of FIG. 3. In this regard, the polyphase digital-to-analog conversion arrangement 448 comprises N−1 number of DACs 450, each having a gain (or coefficient) of $$\frac{1}{N-1},$$

and a switching element 452 coupled between the DACs 450 and the output of the compensation feedback delay element 434. The switching element 452 is configured to cycle or rotate through the N−1 operating modes in a sequential manner with a frequency equal to the sampling frequency of the quantizer 306 (e.g., $f_s$). By virtue of the polyphase decomposition, each DAC 450 may be clocked or operated at a frequency equal to $$\frac{f_s}{N-1}.$$

In an exemplary embodiment, N−1=M, such that the DACs 450 in the polyphase digital-to-analog conversion arrangement 448 are clocked at the same frequency as the DACs in the polyphase digital-to-analog conversion arrangement 428 in the main feedback path 408. As shown, the term of the FIR filtering arrangement having the longest delay associated with it, i.e., the $N^{th}$ term, is implemented in a conventional manner using a DAC 456 and a delay element 454 coupled between the compensation feedback delay element 434 and the DAC 456, wherein the delay element 454 has a delay of N−1 samples. In this regard, the DAC 456 for the term having the longest associated delay is operated at the same frequency as the quantizer 406 (e.g., $f_s$) for purposes of stability.

Figure 5:
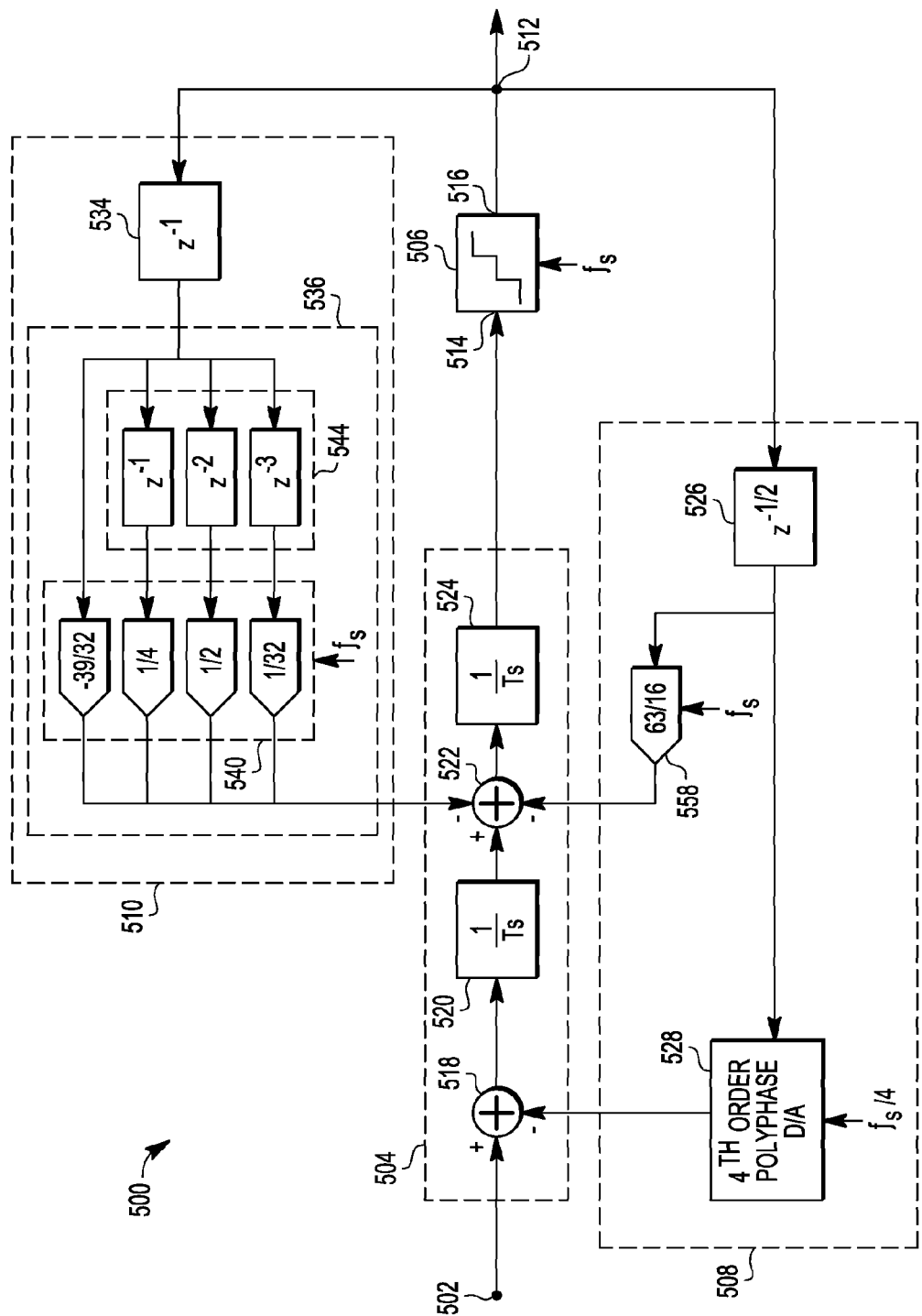
FIG. 5 is a block diagram of a sigma-delta modulator in accordance with yet another embodiment of the invention.

FIG. 5 depicts a sigma-delta modulator 500 in accordance with another embodiment. The elements of the sigma-delta modulator 500 are similar to counterpart elements discussed above in the context of the sigma-delta modulators of FIGS. 1-4, and as such, these common elements will not be redundantly described in detail here in the context of FIG. 5. FIG. 5 depicts a second-order feedback sigma-delta modulator 500 having a noise transfer function of $(1-z^{-1})^2$. In the illustrated embodiment, the main feedback arrangement 508 includes a second digital-to-analog conversion arrangement 558 configured to generate a second main feedback signal at the second summing junction 522 (or alternatively the input of the second integrator 524) based on the output of the main feedback delay element 526. The second main feedback signal adds additional degrees of freedom to the overall sigma-delta modulator 500 transfer function and allows one to adjust various parameters of the transfer function to suit the needs of the particular hardware components of the forward signal path 504 or to otherwise achieve a desired noise transfer function, as will be appreciated in the art. In an exemplary embodiment, the second D/A conversion arrangement 558 is realized as an NRZ DAC configured for a gain of 63/16, and the DAC 558 is clocked or operated at the same frequency as the quantizer 506 ($f_s$). However, in alternative embodiments, the second D/A conversion arrangement 558 may be realized with a RZ DAC.

As shown, the D/A conversion arrangement 528 that is coupled to the input node 502 is realized using a fourth-order polyphase DAC, wherein the D/A conversion arrangement 528 has a gain of one and comprises four DACs each operating at a sampling frequency of $f_s/4$. As set forth above, this reduces the modulator 500 sensitivity to clock jitter and/or other non-idealities of the DACs that make up the D/A conversion arrangement 528. In the illustrated embodiment, the compensation D/A arrangement 536 comprises four DACs 540 and three delay elements 544 which are cooperatively configured to create a fourth order FIR filter. As described above, because the modulator 500 is less sensitive to non-idealities of the DACs which are not coupled to the input of the modulator 500, the DACs 540 of the compensation feedback path 510 may be operated at the same frequency as the quantizer 506 ($f_s$). It should be noted that in the illustrated embodiment, the main feedback delay element 526 has a delay of one half sample ($z^{-1/2}$) and the compensation feedback delay element 534 has a delay of one sample ($z^{-1}$), however, in other embodiments, the delay associated with the main feedback delay element 526 may be greater than the delay associated with the compensation feedback delay element 534.

Figure 6:
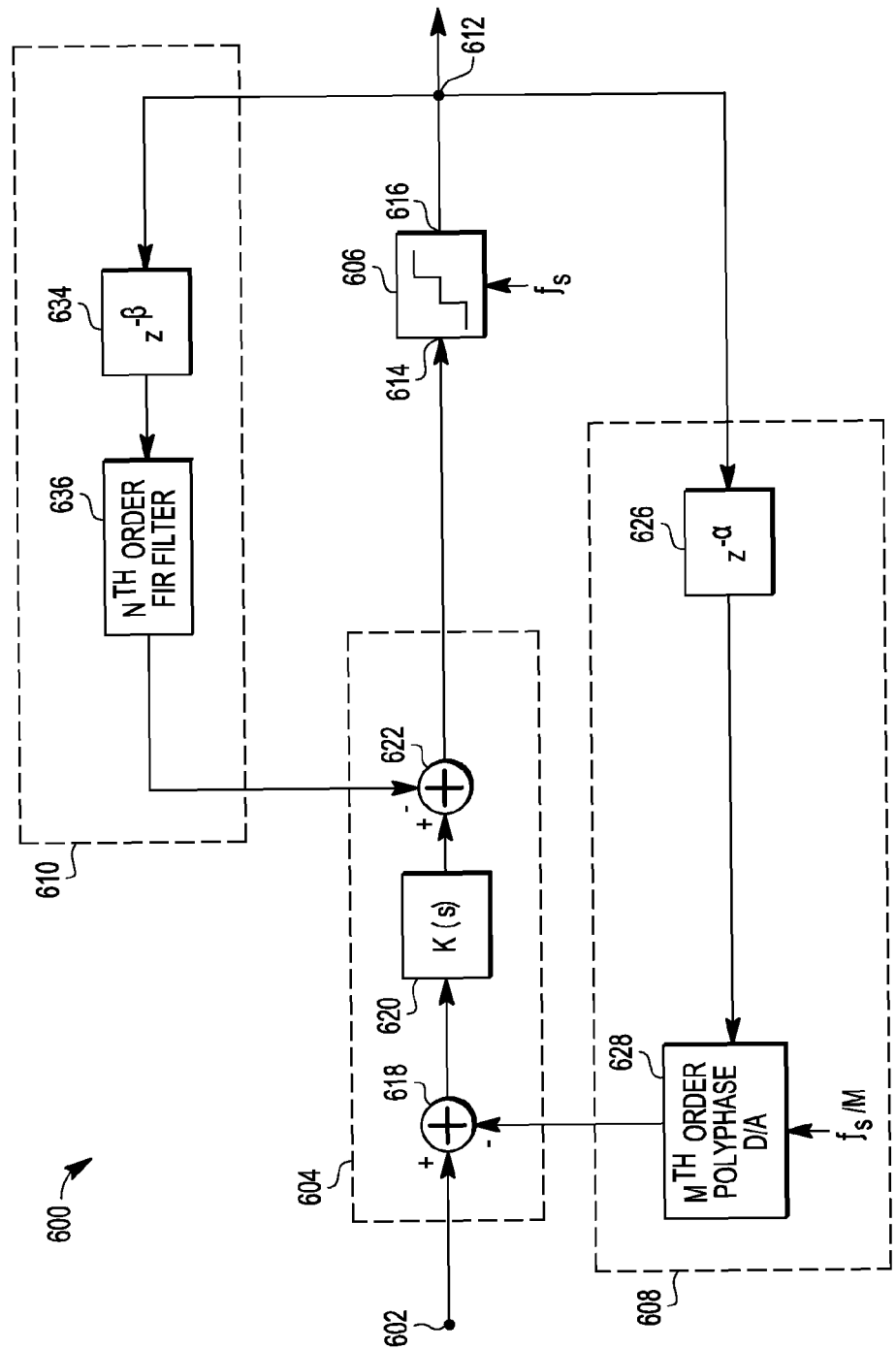
FIG. 6 is a block diagram of a sigma-delta modulator in accordance with yet another embodiment of the invention.

FIG. 6 depicts a sigma-delta modulator 600 in accordance with another embodiment. The elements of the sigma-delta modulator 600 are similar to counterpart elements discussed above in the context of the sigma-delta modulators of FIGS. 1-4, and as such, these common elements will not be redundantly described in detail here in the context of FIG. 6. In the illustrated embodiment, the forward signal path 604 is realized using a feedforward topology comprising a first summing junction 618, a loop filter 620, and a second summing junction 622. As shown, the main feedback D/A conversion arrangement 628 that is coupled to the input node 602 is realized using an $M^{th}$-order polyphase DAC, wherein the main feedback D/A conversion arrangement 628 has a gain of one and comprises M DACs each operating at a sampling frequency of $f_s/M$, in a similar manner as described above. This reduces the modulator 600 sensitivity to clock jitter and/or other non-idealities of the DACs that make up the main feedback D/A conversion arrangement 628, however, in alternative embodiments, the main feedback D/A conversion arrangement 628 may be realized as an FIR filter having NRZ DACs each operating at the quantizer 606 frequency $f_s$. In the illustrated embodiment, the compensation feedback D/A arrangement 636 is realized as an $N^{th}$-order FIR filtering arrangement having NRZ DACs each operating at the quantizer 606 frequency $f_s$, as set forth above. It should be noted that in a feedforward embodiment, the summing junction preceding the input 614 of the quantizer 606, in this case the second summing junction 622, may be implemented as an analog summer. Thus, the compensation feedback path 610 may be implemented to stabilize the sigma-delta modulator 600 and perform excess loop delay compensation with minimal overhead (i.e., only the overhead associated with adding the delay element 634 and the FIR filtering arrangement 636), as additional analog summers are not required and the compensation feedback signals are not required to feed the input of any integrators and/or filters (e.g., loop filter 620) which would affect the voltage swing and/or slew rate requirements for the respective integrator and/or filter. Any non-idealities of the compensation feedback D/A arrangement 636 may be shaped by the loop filter 620 and/or forward signal path 604, as will be appreciated in the art.

One advantage of the systems and/or methods described above is that NRZ feedback signals may be used to compensate for the intentional delay inserted in the main feedback loop for a sigma-delta modulator, and at the same time, FIR filters may be used to reduce the sensitivity of the sigma-delta modulator to various circuit-level effects. The main feedback path to the input of the modulator may be implemented using a polyphase D/A conversion arrangement, thereby allowing the sampling frequency for the NRZ feedback DACs in the main feedback path to be reduced. The modulator may achieve loop delay compensation and reduced jitter sensitivity using only two FIR filters and/or two feedback signals. The area, power, cost and design time of the sigma-delta modulator are reduced while improving the performance of the modulator.

In summary, systems, devices, and methods configured in accordance with example embodiments of the subject matter relate to:

An apparatus is provided for an analog-to-digital converter. The analog-to-digital converter comprises an input node for receiving an input signal and a quantizer configured to convert a first analog signal to a digital value. A forward signal arrangement is coupled between the input node and the quantizer. A first delay element is coupled to the quantizer, and the first delay element is configured to delay the digital value by a first delay period resulting in a first delayed value. A first digital-to-analog conversion arrangement is coupled between the first delay element and the forward signal arrangement. The first digital-to-analog conversion arrangement is configured to generate a first feedback signal by digitally filtering the first delayed value. A second delay element is coupled to the quantizer, and the second delay element is configured to delay the digital value by a second delay period resulting in a second delayed value. A second digital-to-analog conversion arrangement is coupled between the second delay element and the forward signal arrangement. The second digital-to-analog conversion arrangement is configured to generate a second feedback signal by digitally filtering the second delayed value, wherein the forward signal arrangement produces the first analog signal at the quantizer based on the input signal at the input node, the first feedback signal, and the second feedback signal.

In accordance with one embodiment, the quantizer is configured for a first sampling frequency and the first digital-to-analog conversion arrangement is configured for a second sampling frequency, wherein the second sampling frequency is less than the first sampling frequency. In accordance with another embodiment, the first digital-to-analog conversion arrangement comprises a polyphase digital-to-analog conversion arrangement. In a further embodiment, the polyphase digital-to-analog conversion arrangement comprises an integer number of digital-to-analog converters, such that the second sampling frequency is equal to the first sampling frequency divided by the integer number of digital-to-analog converters. In another embodiment, the first digital-to-analog conversion arrangement comprises a first finite impulse response filtering arrangement. In accordance with one embodiment, the first finite impulse response filtering arrangement comprises a fractional delay finite impulse response filtering arrangement. In another embodiment, the first finite impulse response filtering arrangement comprises a lowpass comb filter. In yet another embodiment, the second digital-to-analog conversion arrangement comprises a second finite impulse response filtering arrangement. In accordance with one embodiment, the quantizer comprises a multi-bit quantizer.

In accordance with one embodiment, an apparatus is provided for a sigma-delta modulator. The sigma-delta modulator comprises an input node for receiving an input signal and a quantizer configured to convert a first analog signal to a digital value. A main feedback arrangement is coupled to the quantizer, and the main feedback arrangement is configured to delay the digital value by a first delay period to obtain a first delayed value and generate a main feedback signal by digitally filtering the first delayed value. A compensation feedback arrangement is coupled to the quantizer, and the compensation feedback arrangement is configured to delay the digital value by a second delay period to obtain a second delayed value, and generate a compensation feedback signal by digitally filtering the second delayed value. A forward signal arrangement is coupled between the input node and the quantizer, and the forward signal arrangement is coupled to the main feedback arrangement and the compensation feedback arrangement. The forward signal arrangement produces the first analog signal based on the input signal, the main feedback signal, and the compensation feedback signal.

In accordance with another embodiment, the quantizer is configured for a first sampling frequency and the main feedback arrangement comprises a plurality of digital-to-analog converters configured for a second sampling frequency. The second sampling frequency is less than the first sampling frequency. In another embodiment, the plurality of digital-to-analog converters comprise non-return-to-zero digital-to-analog converters. In accordance with yet another embodiment, the main feedback arrangement comprises a first finite impulse response filtering arrangement configured to generate the main feedback signal by digitally filtering the first delayed value. In yet another embodiment, the compensation feedback arrangement comprises a second finite impulse response filtering arrangement configured to generate the compensation feedback signal by digitally filtering the second delayed value. In another embodiment, the second delay period is not equal to the first delay period. In accordance with one embodiment, the main feedback arrangement is coupled to the input node and the compensation feedback arrangement is coupled to the forward signal arrangement at a summing junction, wherein an element of the forward signal arrangement is coupled between the input node and the summing junction.

In accordance with another embodiment, an apparatus is provided for a sigma-delta modulator. The sigma-delta modulator comprises an input node for receiving an input signal and a first integrator having a first input and a first output, the first input being coupled to the input node. The sigma-delta modulator further comprises a quantizer having a quantizer input and a quantizer output. The quantizer input is coupled to the first output, wherein the quantizer is configured to convert a first analog signal at the quantizer input to a digital value at the quantizer output. A main feedback arrangement is coupled to the quantizer output and the input node. The main feedback arrangement is configured to delay the digital value by a first delay period to obtain a first delayed value and generate a main feedback signal at the input node by digitally filtering the first delayed value. A compensation feedback arrangement is coupled to the quantizer output and the first input. The compensation feedback arrangement is configured to delay the digital value by a second delay period to obtain a second delayed value, and generate a compensation feedback signal at the first input by digitally filtering the second delayed value.

In accordance with one embodiment, the sigma-delta modulator further comprises a second integrator coupled between the input node and the first integrator, the second integrator having a second input coupled to the input node and a second output coupled to the first input. In another embodiment, the main feedback arrangement comprises a first delay element coupled to the quantizer output, wherein the first delay element is configured to delay the digital value by the first delay period resulting in the first delayed value. The main feedback arrangement further comprises a plurality of digital-to-analog converters coupled between the first delay element and the input node. The plurality of digital-to-analog converters are configured to generate the main feedback signal based at least in part on the first delayed value. In accordance with one embodiment, the quantizer is configured to convert a first analog signal at the quantizer input to a digital value at the quantizer output with a first sampling frequency and the plurality of digital-to-analog converters are configured for operation at a second sampling frequency, wherein the second sampling frequency is less than or equal to the first sampling frequency.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An analog-to-digital converter comprising:
   an input node for receiving an input signal;
   a quantizer configured to convert a first analog signal to a digital value with a first sampling frequency;
   a forward signal arrangement coupled between the input node and the quantizer;
   a first delay element coupled to the quantizer, the first delay element being configured to delay the digital value by a first delay period resulting in a first delayed value;
   a first digital-to-analog conversion arrangement coupled between the first delay element and the forward signal arrangement, the first digital-to-analog conversion arrangement being configured to generate a first feedback signal by digitally filtering the first delayed value, the first digital-to-analog conversion arrangement being configured for a second sampling frequency, the second sampling frequency being less than the first sampling frequency;
   a second delay element coupled to the quantizer, the second delay element being configured to delay the digital value by a second delay period resulting in a second delayed value; and
   a second digital-to-analog conversion arrangement coupled between the second delay element and the forward signal arrangement, the second digital-to-analog conversion arrangement being configured to generate a second feedback signal by digitally filtering the second delayed value, wherein the forward signal arrangement produces the first analog signal based on the input signal, the first feedback signal, and the second feedback signal.

2. The analog-to-digital converter of claim 1, wherein the first digital-to-analog conversion arrangement comprises a polyphase digital-to-analog conversion arrangement.

3. The analog-to-digital converter of claim 2, wherein the polyphase digital-to-analog conversion arrangement comprises an integer number of digital-to-analog converters, such that the second sampling frequency is equal to the first sampling frequency divided by the integer number of digital-to-analog converters.

4. The analog-to-digital converter of claim 1, wherein the first digital-to-analog conversion arrangement comprises a first finite impulse response filtering arrangement.

5. The analog-to-digital converter of claim 4, wherein the first finite impulse response filtering arrangement comprises a fractional delay finite impulse response filtering arrangement.

6. The analog-to-digital converter of claim 4, wherein the first finite impulse response filtering arrangement comprises a lowpass comb filter.

7. The analog-to-digital converter of claim 4, wherein the second digital-to-analog conversion arrangement comprises a second finite impulse response filtering arrangement.

8. The analog-to-digital converter of claim 1, wherein the quantizer comprises a multi-bit quantizer.

9. A sigma-delta modulator comprising:
   an input node for receiving an input signal;
   a quantizer configured to convert a first analog signal to a digital value with a first sampling frequency;
   a main feedback arrangement coupled to the quantizer, the main feedback arrangement comprising a plurality of digital-to-analog converters configured for a second sampling frequency that is less than the first sampling frequency, the main feedback arrangement being configured to:
     delay the digital value by a first delay period to obtain a first delayed value; and
     generate a main feedback signal by digitally filtering the first delayed value;
   a compensation feedback arrangement coupled to the quantizer, the compensation feedback arrangement being configured to:
     delay the digital value by a second delay period to obtain a second delayed value; and
     generate a compensation feedback signal by digitally filtering the second delayed value; and
   a forward signal arrangement coupled between the input node and the quantizer, the forward signal arrangement being coupled to the main feedback arrangement and the compensation feedback arrangement, wherein the forward signal arrangement produces the first analog signal based on the input signal, the main feedback signal, and the compensation feedback signal.

10. The sigma-delta modulator of claim 9, wherein the plurality of digital-to-analog converters comprise non-return-to-zero digital-to-analog converters.

11. The sigma-delta modulator of claim 9, wherein the main feedback arrangement comprises a first finite impulse response filtering arrangement configured to generate the main feedback signal by digitally filtering the first delayed value.

12. The sigma-delta modulator of claim 11, wherein the compensation feedback arrangement comprises a second finite impulse response filtering arrangement configured to generate the compensation feedback signal by digitally filtering the second delayed value.

13. The sigma-delta modulator of claim 9, wherein the second delay period is not equal to the first delay period.

14. The sigma-delta modulator of claim 9, wherein the main feedback arrangement is coupled to the input node and the compensation feedback arrangement is coupled to the forward signal arrangement at a summing junction, wherein an element of the forward signal arrangement is coupled between the input node and the summing junction.

15. A sigma-delta modulator comprising:

an input node for receiving an input signal;

a first integrator having a first input and a first output, the first input being coupled to the input node;

a quantizer having a quantizer input and a quantizer output, the quantizer input being coupled to the first output, wherein the quantizer is configured to convert a first analog signal at the quantizer input to a digital value at the quantizer output with a first sampling frequency;

a main feedback arrangement coupled to the quantizer output and the input node, the main feedback arrangement comprising a plurality of digital-to-analog converters configured for operation at a second sampling frequency that is less than the first sampling frequency, the main feedback arrangement being configured to:

delay the digital value by a first delay period to obtain a first delayed value; and generate a main feedback signal at the input node by digitally filtering the first delayed value; and a compensation feedback arrangement coupled to the quantizer output and the first input, the compensation feedback arrangement being configured to:

delay the digital value by a second delay period to obtain a second delayed value; and generate a compensation feedback signal at the first input by digitally filtering the second delayed value.

16. The sigma-delta modulator of claim 15, further comprising a second integrator coupled between the input node and the first integrator, the second integrator having a second input coupled to the input node and a second output coupled to the first input.

17. The sigma-delta modulator of claim 15, wherein the main feedback arrangement comprises:

a first delay element coupled to the quantizer output, the first delay element being configured to delay the digital value by the first delay period resulting in the first delayed value, wherein the plurality of digital-to-analog converters are coupled between the first delay element and the input node, the plurality of digital-to-analog converters being configured to generate the main feedback signal based at least in part on the first delayed value.

18. The sigma-delta modulator of claim 17, wherein the compensation feedback arrangement comprises:

a second delay element coupled to the quantizer output, the second delay element being configured to delay the digital value by a second delay period to obtain the second delayed value; and a compensation digital-to-analog conversion arrangement configured to generate the compensation feedback signal at the first input by digitally filtering the second delayed value, the compensation digital-to-analog conversion arrangement including at least one digital-to-analog converter configured for operation at the first sampling frequency.

19. The sigma-delta modulator of claim 18, wherein the second delay period and the first delay period are different.

* * * * *